United States Patent
Ota et al.

(10) Patent No.: US 9,614,103 B2
(45) Date of Patent: Apr. 4, 2017

(54) SEMICONDUCTOR DEVICE AND METHOD FOR MANUFACTURING THE SAME

(71) Applicant: Kabushiki Kaisha Toshiba, Minato-ku (JP)

(72) Inventors: Kensuke Ota, Kawasaki (JP);
Toshifumi Irisawa, Bunkyo (JP);
Masumi Saitoh, Yokkaichi (JP);
Kiwamu Sakuma, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/002,002

(22) Filed: Jan. 20, 2016

(65) Prior Publication Data
US 2016/0218224 A1 Jul. 28, 2016

(30) Foreign Application Priority Data

Jan. 22, 2015 (JP) ................................ 2015-010050

(51) Int. Cl.
*H01L 29/10* (2006.01)
*H01L 29/786* (2006.01)
*H01L 21/306* (2006.01)
*H01L 21/324* (2006.01)
*H01L 29/49* (2006.01)
*H01L 29/66* (2006.01)
*H01L 21/3213* (2006.01)

(52) U.S. Cl.
CPC .. *H01L 29/78693* (2013.01); *H01L 21/30604* (2013.01); *H01L 21/324* (2013.01); *H01L 29/4908* (2013.01); *H01L 29/66742* (2013.01); *H01L 21/32134* (2013.01)

(58) Field of Classification Search
CPC ......... H01L 29/78693; H01L 29/66742; H01L 29/4908; H01L 21/30604; H01L 21/324
USPC ............................................. 257/43; 437/104
See application file for complete search history.

(56) References Cited

U.S. PATENT DOCUMENTS

| 7,981,734 B2 | 7/2011 | Furuta et al. | |
| 2011/0084268 A1* | 4/2011 | Yamazaki | H01L 27/1214 257/43 |

(Continued)

FOREIGN PATENT DOCUMENTS

| JP | 2011-228622 | 11/2011 |
| JP | 2013-175717 | 9/2013 |
| JP | 2016-18938 A | 2/2016 |

OTHER PUBLICATIONS

Jaechul Park, et al., "Self-aligned top-gate amorphous gallium indium zinc oxide thin film transistors", Applied Physics Letters, (93), 2008, 4 pgs.

*Primary Examiner* — Trung Q Dang
(74) *Attorney, Agent, or Firm* — Oblon, McClelland, Maier & Neustadt, L.L.P.

(57) ABSTRACT

A semiconductor device according to an embodiment includes a first region including an oxide semiconductor containing indium (In), gallium (Ga), and zinc (Zn), a second region and a third region between which the first region is disposed, at least one of the second region and the third region having a higher indium (In) concentration than the first region and containing at least one metal element from the group consisting of titanium (Ti), tungsten (W), copper (Cu), zinc (Zn), aluminum (Al), lead (Pb), and tin (Sn), an electrode; and an insulating layer disposed between the first region and the electrode.

17 Claims, 15 Drawing Sheets

(56) References Cited

U.S. PATENT DOCUMENTS

2011/0084272 A1* 4/2011 Miyanaga ............... H01L 29/45
                                                                  257/43
2011/0240998 A1  10/2011 Morosawa et al.
2012/0248432 A1* 10/2012 Noda ................ H01L 21/02472
                                                              257/43
2016/0013214 A1   1/2016 Ota et al.

* cited by examiner

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-010050, filed on Jan. 22, 2015, the entire contents of which are incorporated herein by reference.

FIELD

Embodiments described herein relate generally to a semiconductor device and a method for manufacturing the same.

BACKGROUND

An oxide semiconductor such as InGaZnO has been mainly applied to a device for a display. An application thereof to a thin film field effect transistor formed on a wiring layer of a large scale integrated circuit (LSI) is also expected. The thin film field effect transistor formed for an LSI is particularly required to reduce the size thereof.

Therefore, as in a conventional silicon transistor, it is preferable to form a top gate structure in which a source/drain region can be formed by self alignment with respect to a gate electrode. However, unlike the conventional silicon transistor, it is difficult to form a diffusion layer by injecting impurities or to form a metal layer such as a silicide in the oxide semiconductor transistor. Therefore, it is difficult to achieve low-resistance source/drain region with the top gate structure. Consequently, in the top gate structure, a large parasitic resistance of source/drain region become a problem.

DETAILED DESCRIPTION

A semiconductor device according to an embodiment includes a first region including an oxide semiconductor containing indium (In), gallium (Ga), and zinc (Zn), a second region and a third region between which the first region is disposed, at least one of the second region and the third region having a higher indium (In) concentration than the first region and containing at least one metal element from the group consisting of titanium (Ti), tungsten (W), copper (Cu), zinc (Zn), aluminum (Al), lead (Pb), and tin (Sn), an electrode, and an insulating layer disposed between the first region and the electrode.

Here, the same reference sign is given to the same or similar components, and repeated description thereof may be omitted.

In the description below, "upper", "lower", "upward", "downward", "upper surface", and "lower surface" only indicate relative positional relations between components or the like, and do not necessarily define a relation to the gravity direction.

Hereinafter, embodiments of the present disclosure will be described with reference to the drawings.

(First Embodiment)

A semiconductor device of the present embodiment includes a channel region of an oxide semiconductor containing indium (In), gallium (Ga), and zinc (Zn), a source region and a drain region which are provided so as to sandwich the channel region therebetween and at least one of which has a higher indium (In) concentration than the channel region and contains at least one metal element selected from the group consisting of titanium (Ti), tungsten (W), copper (Cu), zinc (Zn), aluminum (Al), lead (Pb), and tin (Sn), a gate insulating film provided on the channel region, and a gate electrode provided on the gate insulating film.

Figure 1A:
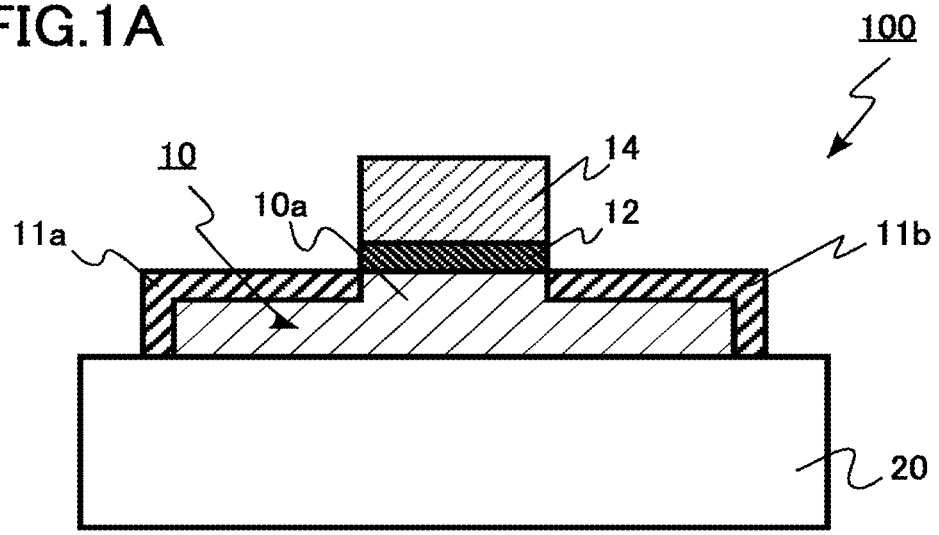
FIGS. 1A and 1B are schematic views of a semiconductor device according to a first embodiment.
Figure 1B:
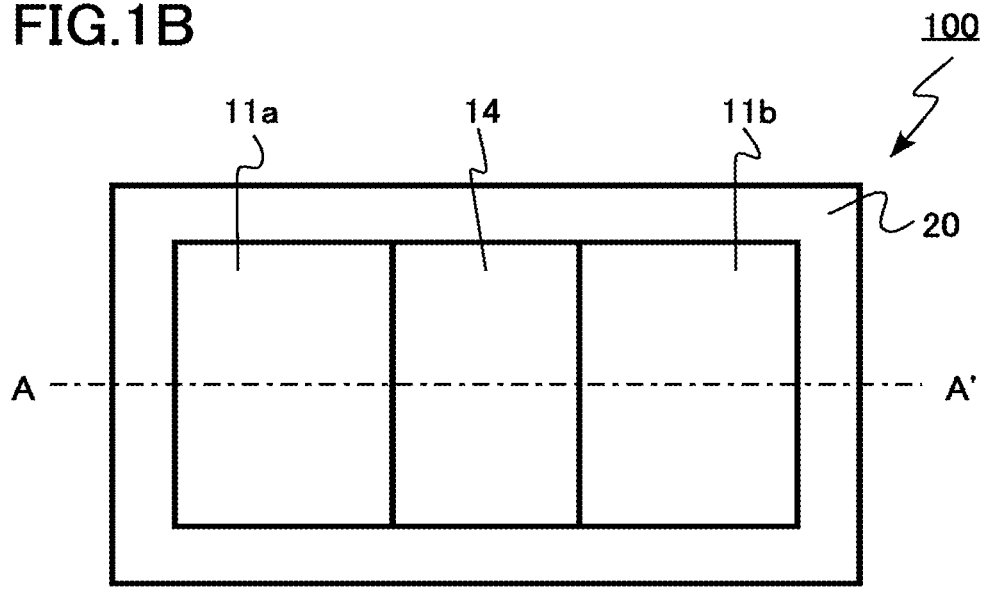

FIGS. 1A and 1B are schematic views of the semiconductor device of the present embodiment. FIG. 1A is across sectional view, and FIG. 1B is a top view. FIG. 1A is a cross sectional view cut by AA' in FIG. 1B.

A semiconductor device 100 of the present embodiment includes an oxide semiconductor layer 10, a gate insulating film (insulating layer) 12, a gate electrode 14, a channel region 10*a* (first region), a source region (second region) 11*a*, a drain region (third region) 11*b*, and an insulating film 20. The semiconductor device 100 is a thin film field effect transistor using the oxide semiconductor layer 10.

The oxide semiconductor layer 10 contains indium (In), gallium (Ga), and zinc (Zn) as main components. The oxide semiconductor layer 10 is made, for example, of InGaZnO.

In the oxide semiconductor layer 10, for example, indium, gallium, and zinc occupy 50% by atom or more of the constitutional elements other than oxygen. The oxide semiconductor layer 10 may contain at least one element selected from the group consisting of hafnium (Hf), tin (Sn), aluminum (Al), zirconium (Zr), lithium (Li), scandium (Sc), and nitrogen (N) as an addition element.

The oxide semiconductor layer 10 is preferably amorphous from a viewpoint of forming the semiconductor device 100 at a low temperature. The oxide semiconductor layer 10 can be crystalline.

The channel region 10*a* is provided in the oxide semiconductor layer 10. The channel region 10*a* is an oxide semiconductor containing indium, gallium, and zinc. The channel region 10*a* is preferably amorphous.

In the channel region 10*a*, the concentration of a carrier changes by change of a potential due to a voltage applied to the gate electrode 14. When the thin film field effect transistor 100 performs an on-operation, the carrier flows in the channel region 10*a*. The carrier is, for example, an electron.

The source region 11*a* and the drain region 11*b* are provided on the oxide semiconductor layer 10. The source region 11*a* and the drain region 11*b* are provided so as to sandwich the channel region 10*a* therebetween. At least one of the source region 11*a* and the drain region 11*b* has a higher indium concentration than the channel region 10*a*, and contains at least one metal element selected from the group consisting of titanium (Ti), tungsten (W), copper (Cu), zinc (Zn), aluminum (Al), lead (Pb), and tin (Sn). In the present embodiment, each of the source region 11*a* and the drain region 11*b* has a higher indium (In) concentration than the channel region, and contains at least one metal element selected from the group consisting of titanium (Ti), tungsten (W), copper (Cu), zinc (Zn), aluminum (Al), lead (Pb), and tin (Sn).

The indium (In) concentration in at least one of the source region 11*a* and the drain region 11*b* is higher than the indium concentration in the oxide semiconductor layer 10 under the source region 11*a* and the drain region 11*b*. In the present embodiment, the indium concentration in each of the source region 11*a* and the drain region 11*b* is higher than the indium concentration in the oxide semiconductor layer 10 under the source region 11*a* and the drain region 11*b*.

The source region 11*a* and the drain region 11*b* are preferably made of metal from a viewpoint of reducing a resistance. The source region 11*a* and the drain region 11*b* are made, for example, of an alloy of indium and one of the above metal elements. The source region 11*a* and the drain region 11*b* are made, for example, of a polycrystalline alloy.

The oxygen concentration in at least one of the source region 11*a* and the drain region 11*b* is preferably lower than the oxygen concentration in the channel region 10*a*. The lowest oxygen concentration in at least one of the source region 11*a* and the drain region 11*b* is preferably lower than the lowest oxygen concentration in the channel region 10*a*. The zinc concentration in at least one of the source region 11*a* and the drain region 11*b* is preferably lower than the zinc concentration in the channel region 10*a*. The gallium concentration in at least one of the source region 11*a* and the drain region 11*b* is preferably lower than the gallium concentration in the channel region 10*a*.

The oxygen concentration in at least one of the source region 11*a* and the drain region 11*b* is preferably lower than the oxygen concentration in the oxide semiconductor layer 10 under the source region 11*a* and the drain region 11*b*. The lowest oxygen concentration in at least one of the source region 11*a* and the drain region 11*b* is preferably lower than the lowest oxygen concentration in the oxide semiconductor layer 10 under the source region 11*a* and the drain region 11*b*. The zinc concentration in at least one of the source region 11*a* and the drain region 11*b* is preferably lower than the zinc concentration in the oxide semiconductor layer 10 under the source region 11*a* and the drain region 11*b*. The gallium concentration in at least one of the source region 11*a* and the drain region 11*b* is preferably lower than the gallium concentration in the oxide semiconductor layer 10 under the source region 11*a* and the drain region 11*b*.

Each of the indium concentration, the oxygen concentration, the zinc concentration, and the gallium concentration in the source region 11*a* or the drain region 11*b* is a concentration at the center in a film thickness direction. The indium concentration, the oxygen concentration, the zinc concentration, and the gallium concentration in the channel region 10*a* is, for example, a concentration at the center in a film thickness direction just below the center of the gate electrode 14.

For example, it is possible to measure presence of an element in the oxide semiconductor layer 10, the channel region 10*a*, and the source region 11*a* or the drain region 11*b*, and magnitude of a concentration thereof by scanning transmission electron microscopy-electron energy loss spectroscopy (STEM-EELS).

The film thickness of the oxide semiconductor layer 10 provided with the channel region 10*a* is preferably 8 nm or more from a viewpoint of preventing reduction in mobility of the carrier. The oxide semiconductor layer 10 has a film thickness, for example, of 8 nm or more and 100 nm or less.

The film thickness of the source region 11*a* or the drain region 11*b* is preferably 3 nm or more from a viewpoint of reducing a parasitic resistance. The source region 11*a* or the drain region 11*b* has a film thickness, for example, of 3 nm or more and 20 nm or less.

For example, the film thickness of the oxide semiconductor layer 10 or the film thickness of the source region 11*a* or the drain region 11*b* can be measured on an image of a transmission electron microscope (TEM).

The gate insulating film 12 is provided on the channel region 10*a*. Examples of the gate insulating film 12 include a silicon oxide film, a silicon nitride film, a silicon oxynitride film, an aluminum oxide ($Al_2O_3$) film, an Hf-containing high-k film, and a stacked film thereof.

The gate electrode 14 is provided on the gate insulating film 12. The gate electrode 14 is made, for example, of metal. Examples of a material of the gate electrode 14 include a metal such as copper (Cu), titanium (Ti), molybdenum (Mo), aluminum (Al), or tungsten (W), and an alloy thereof.

The oxide semiconductor layer 10 is formed on the insulating film 20. The insulating film 20 is, for example, a silicon oxide film.

Next, a method for manufacturing the semiconductor device of the present embodiment will be described. The method for manufacturing the semiconductor device of the present embodiment includes forming an oxide semiconductor layer containing indium (In), gallium (Ga), and zinc (Zn), forming agate insulating film on the oxide semiconductor layer, forming a gate electrode on the gate insulating film, forming a metal film containing at least one metal element selected from the group consisting of titanium (Ti), tungsten (W), copper (Cu), zinc (Zn), aluminum (Al), lead (Pb), and tin (Sn) on portions of the oxide semiconductor layer, the portions being exposed on both sides of the gate electrode, performing a heat treatment in a nonoxidizing atmosphere for one second or more and five minutes or less and reacting the metal film with the oxide semiconductor layer to form a reacted layer, and removing the unreacted metal film by wet etching.

FIGS. 2 to 8 are schematic cross sectional views illustrating the method for manufacturing the semiconductor device of the present embodiment. FIGS. 2 to 8 illustrate cross sections corresponding to the AA' cross section in FIG. 1B.

Figure 2:
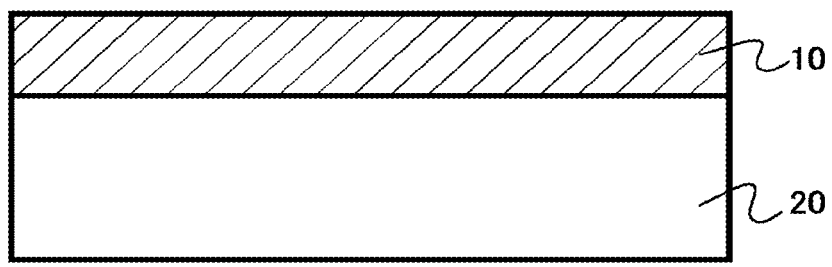
FIG. 2 is a schematic cross sectional view illustrating a method for manufacturing the semiconductor device according to the first embodiment.

The oxide semiconductor layer 10 containing indium, gallium, and zinc, for example, InGaZnO is formed on the insulating film 20. The oxide semiconductor layer 10 is formed, for example, by a sputtering method (FIG. 2). The oxide semiconductor layer 10 preferably has a film thickness of 8 nm or more.

Figure 3:
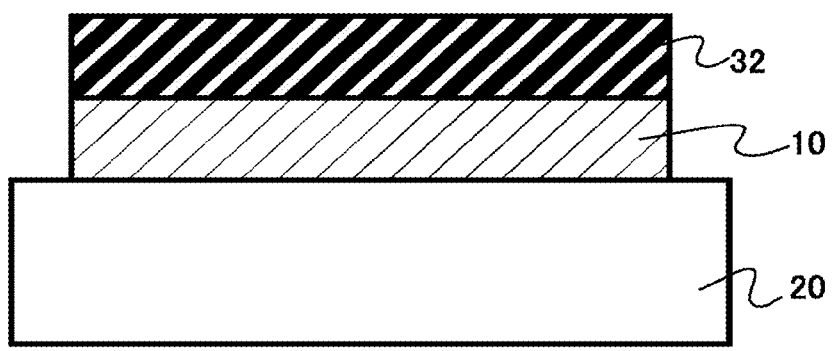
FIG. 3 is a schematic cross sectional view illustrating the method for manufacturing the semiconductor device according to the first embodiment.

Subsequently, the oxide semiconductor layer 10 is patterned using a mask material 32 as a mask (FIG. 3). The mask material 32 is, for example, a resist mask formed by a lithography method. It is possible to pattern the oxide semiconductor layer 10, for example, by dry etching or wet etching. After the oxide semiconductor layer 10 is patterned, the mask material 32 is removed.

Figure 4:
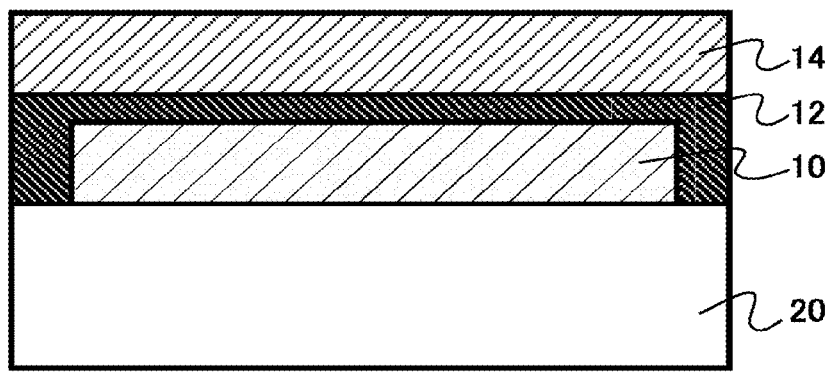
FIG. 4 is a schematic cross sectional view illustrating the method for manufacturing the semiconductor device according to the first embodiment.

Subsequently, the gate insulating film 12 and the gate electrode 14 are formed on the oxide semiconductor layer 10 (FIG. 4). The gate insulating film 12 is formed, for example, by an atomic layer deposition (ALD) method or a chemical vapor deposition (CVD) method. The gate insulating film 12 is, for example, a silicon oxide film. The gate electrode 14 is formed, for example, by a CVD method, a sputtering method, or a vapor deposition method. The gate electrode 14 is made, for example, of molybdenum (Mo).

Figure 5:
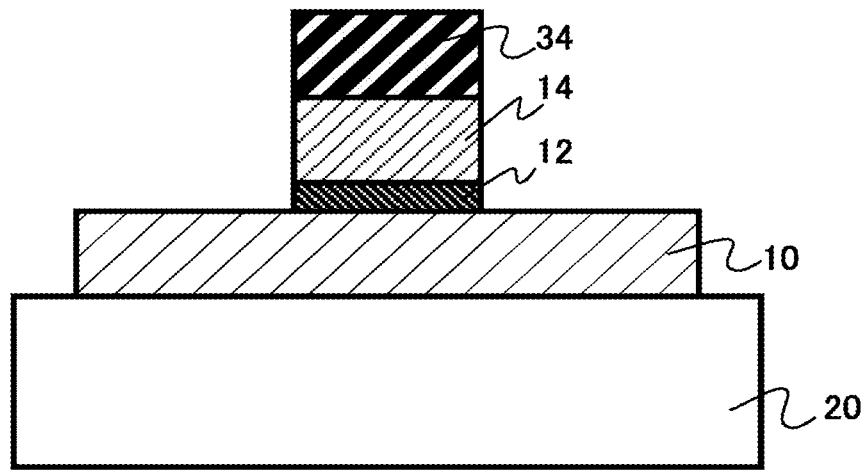
FIG. 5 is a schematic cross sectional view illustrating the method for manufacturing the semiconductor device according to the first embodiment.

Subsequently, a mask material 34 is formed, and the gate insulating film 12 and the gate electrode 14 are patterned (FIG. 5). The mask material 34 is, for example, a resist mask formed by a lithography method. It is possible to pattern the gate insulating film 12 and the gate electrode 14, for example, by dry etching or wet etching. After the gate insulating film 12 and the gate electrode 14 are patterned, the mask material 34 is removed.

Figure 6:
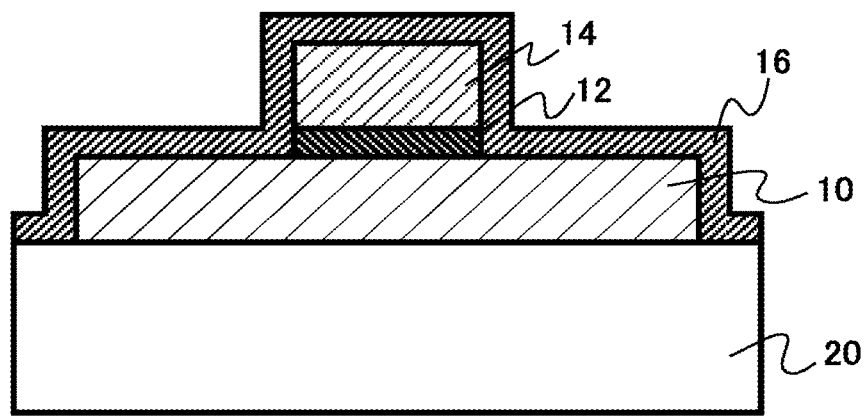
FIG. 6 is a schematic cross sectional view illustrating the method for manufacturing the semiconductor device according to the first embodiment.

Subsequently, a metal film 16 containing at least one metal element selected from the group consisting of titanium (Ti), tungsten (W), copper (Cu), zinc (Zn), aluminum (Al), lead (Pb), and tin (Sn) is formed on the oxide semiconductor layer 10 on both sides of the gate electrode 14 (FIG. 6). The metal film 16 is formed, for example, by a CVD method, a sputtering method, or a vapor deposition method. The metal film 16 is, for example, a metal film of the above metal element or a nitride film thereof.

The metal film 16 is made, for example, of titanium (Ti). It is also possible to use titanium nitride (TiN) in place of titanium. The film thickness of the metal film 16 is preferably 1 nm or more and 100 nm or less, more preferably 1 nm or more and 30 nm or less.

Subsequently, a heat treatment is performed in a nonoxidizing atmosphere for one second or more and five minutes or less. By this heat treatment, the metal film 16 is reacted with the oxide semiconductor layer 10. By this heat treatment, a reacted layer having a higher indium (In) concentration than the a portion of oxide semiconductor layer 10 facing the gate electrode 14 and containing the above metal element is formed.

Figure 7:
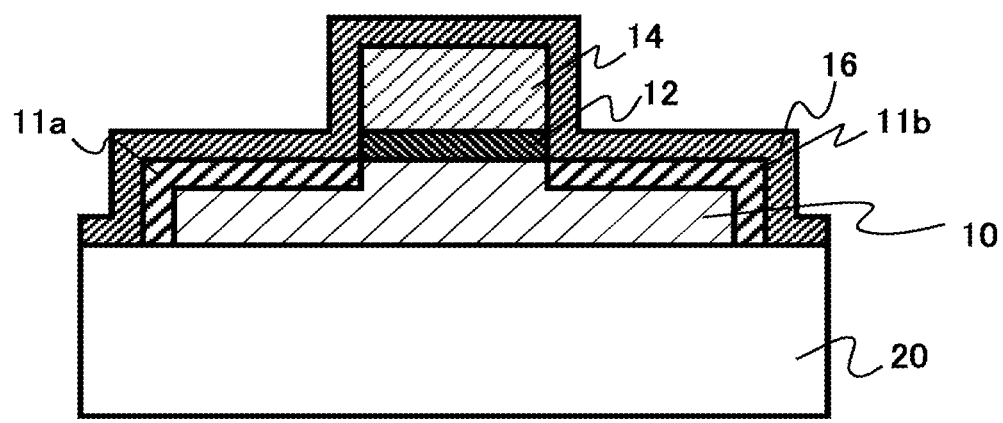
FIG. 7 is a schematic cross sectional view illustrating the method for manufacturing the semiconductor device according to the first embodiment.

The reacted layer formed by the heat treatment becomes the source region 11a and the drain region 11b (FIG. 7).

The heat treatment is performed, for example, by rapid thermal anneal (RTA). The nonoxidizing atmosphere is, for example, a nitrogen atmosphere or an argon atmosphere. When the heat treatment is performed in an oxidizing atmosphere, there is a risk of not forming a reacted layer having a low resistance. In addition, there is a risk of having difficulty in removing the oxide of the metal film 16.

The time for the heat treatment is one second or more and five minutes or less. The time for the heat treatment is preferably one minute or less. When the time for the heat treatment is outside the above range, there is a risk of hindering formation of a reacted layer having a low resistance.

The temperature of the heat treatment is preferably 100° C. or higher and 1000° C. or lower, more preferably 200° C. or higher and 400° C. or lower. When the temperature of the heat treatment is outside the above range, there is a risk of hindering formation of a reacted layer having a low resistance.

Figure 8:
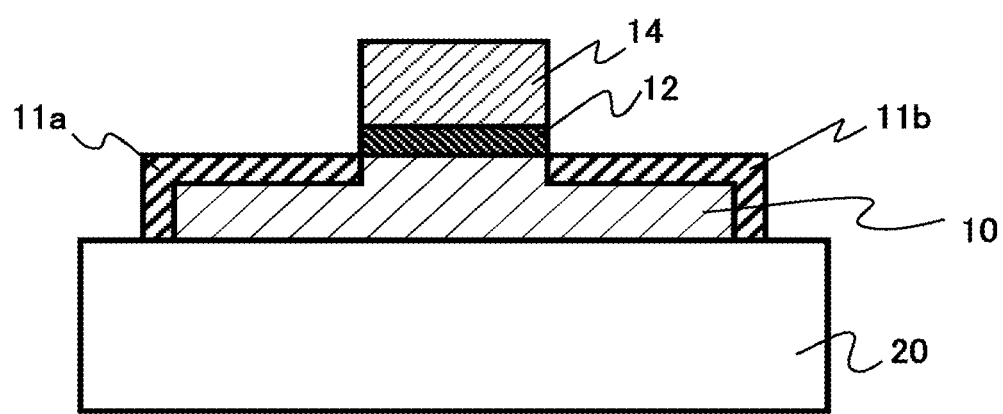
FIG. 8 is a schematic cross sectional view illustrating the method for manufacturing the semiconductor device according to the first embodiment.

Subsequently, the unreacted metal film 16 is removed by wet etching (FIG. 8). It is preferable to use a neutral or alkali solution for wet etching in order to prevent the oxide semiconductor layer 10 from being etched. For example, when the metal film 16 is made of titanium (Ti), hydrogen peroxide water ($H_2O_2$) is used. For example, when the metal film 16 is made of aluminum (Al), lead (Pb), or tin (Sn), an alkali solution is used.

The semiconductor device 100 of the present embodiment illustrated in FIGS. 1A and 1B is manufactured by the manufacturing method described above.

Next, functions and effects of the semiconductor device of the present embodiment and the method for manufacturing the same will be described.

FIGS. 9 to 13 illustrate the functions and effects of the present embodiment.

Figure 9:
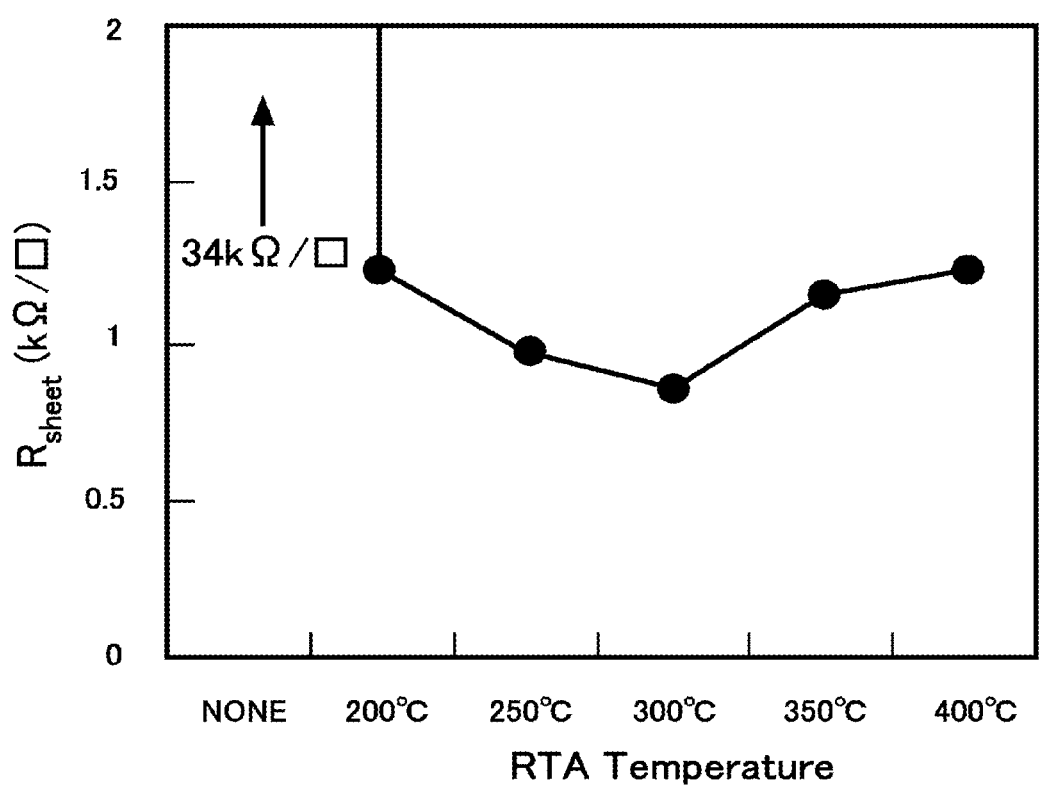
FIG. 9 illustrates functions and effects of the first embodiment.

FIG. 9 illustrates measurement results of a sheet resistance of a sample.

A titanium film was vapor-deposited on the InGaZnO film on the silicon oxide film, and a heat treatment was performed. After the heat treatment, the unreacted titanium film was removed with hydrogen peroxide water. The film thickness of the InGaZnO film was 30 nm, and the film thickness of the titanium film was 20 nm. The heat treatment was performed in a nitrogen atmosphere by RTA for one minute. The temperature was within the range of 200° C. to 400° C. For comparison, a sample without the heat treatment was also prepared.

As illustrated in FIG. 9, the sheet resistance 34 k$\Omega$/□ without the heat treatment was reduced to about 0.8 k$\Omega$/□ to 1.3 k$\Omega$/□ by the method of the present embodiment. It is considered that the InGaZnO film was reacted with the metal film to form a reacted layer having a low resistance.

Figure 10:
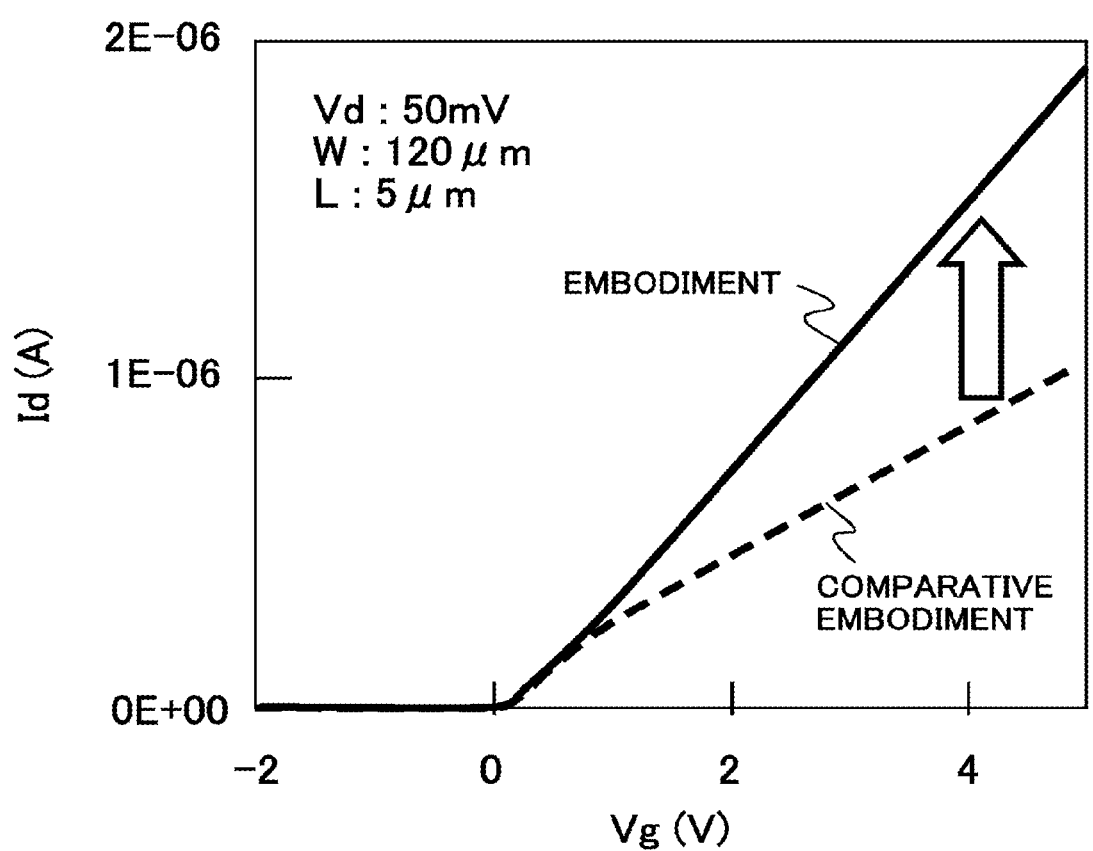
FIG. 10 illustrates functions and effects of the first embodiment.

FIG. 10 illustrates drain current characteristics of a thin film field effect transistor manufactured by the manufacturing method of the present embodiment. The horizontal axis represents a gate voltage, and the vertical axis represents a drain current.

The transistor of the present embodiment has a gate length (L) of 5 μm and a gate width (W) of 120 μm. The drain voltage was constantly 50 mV. For comparison, a transistor of a comparative embodiment was prepared. In the transistor of the comparative embodiment, the resistance in a source region or a drain region was reduced by an argon plasma treatment.

Figure 11:
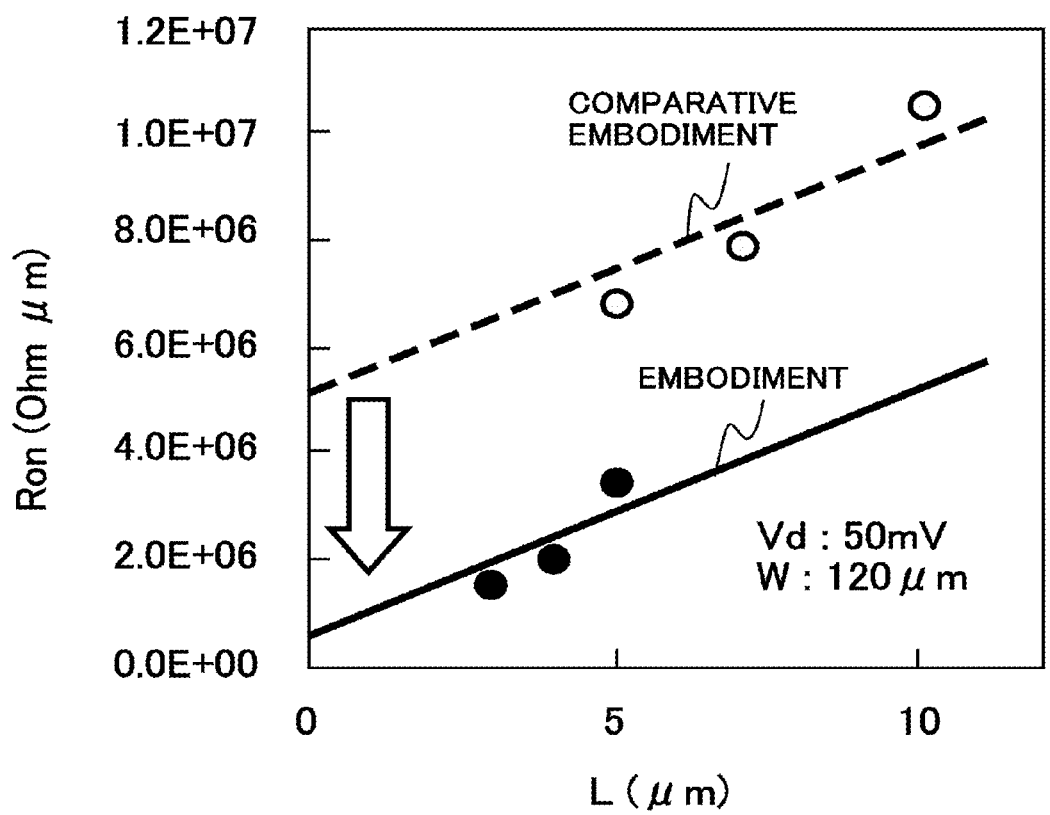
FIG. 11 illustrates functions and effects of the first embodiment.

FIG. 11 illustrates a relation between the gate length (L) and an on-resistance of the transistor in each of the embodiment and the comparative embodiment. The horizontal axis represents the gate length of the transistor, and the vertical axis represents the on-resistance.

In FIG. 11, the y intercept of the on-resistance represents a parasitic resistance of each transistor. This indicates that the transistor of the embodiment has a lower parasitic resistance than the transistor of the comparative embodiment by about one order of magnitude. It is considered that the transistor of the embodiment increased the drain current as illustrated in FIG. 10 due to the lower parasitic resistance than that of the transistor of the comparative embodiment.

Figure 12:
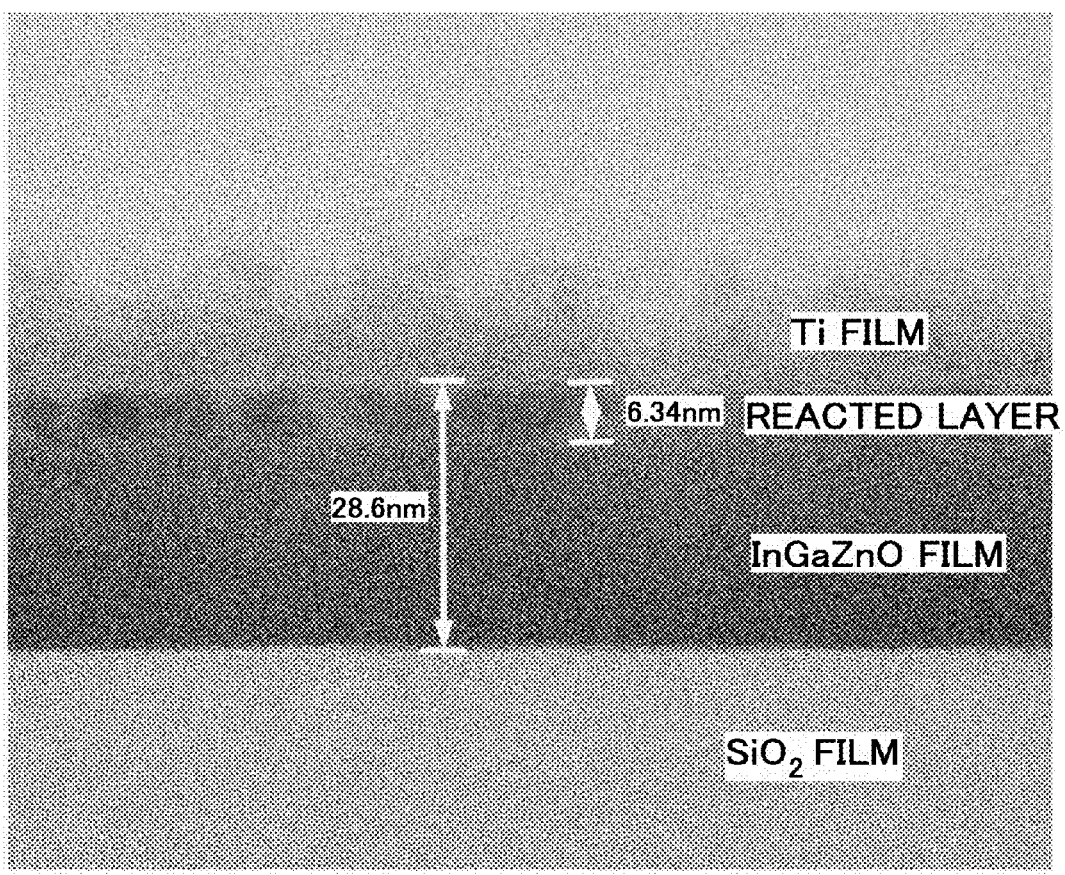
FIG. 12 illustrates functions and effects of the first embodiment.

FIG. 12 is a photograph of a cross section of a sample manufactured by the manufacturing method of the present embodiment. FIG. 12 is a transmission electron microscope (TEM) image after the sample is subjected to RTA.

A reacted layer having a film thickness of about 6 nm is formed between the InGaZnO film and the titanium (Ti) film. A grain boundary is confirmed in the reacted layer, and is considered to be a polycrystalline metal layer.

Figure 13:
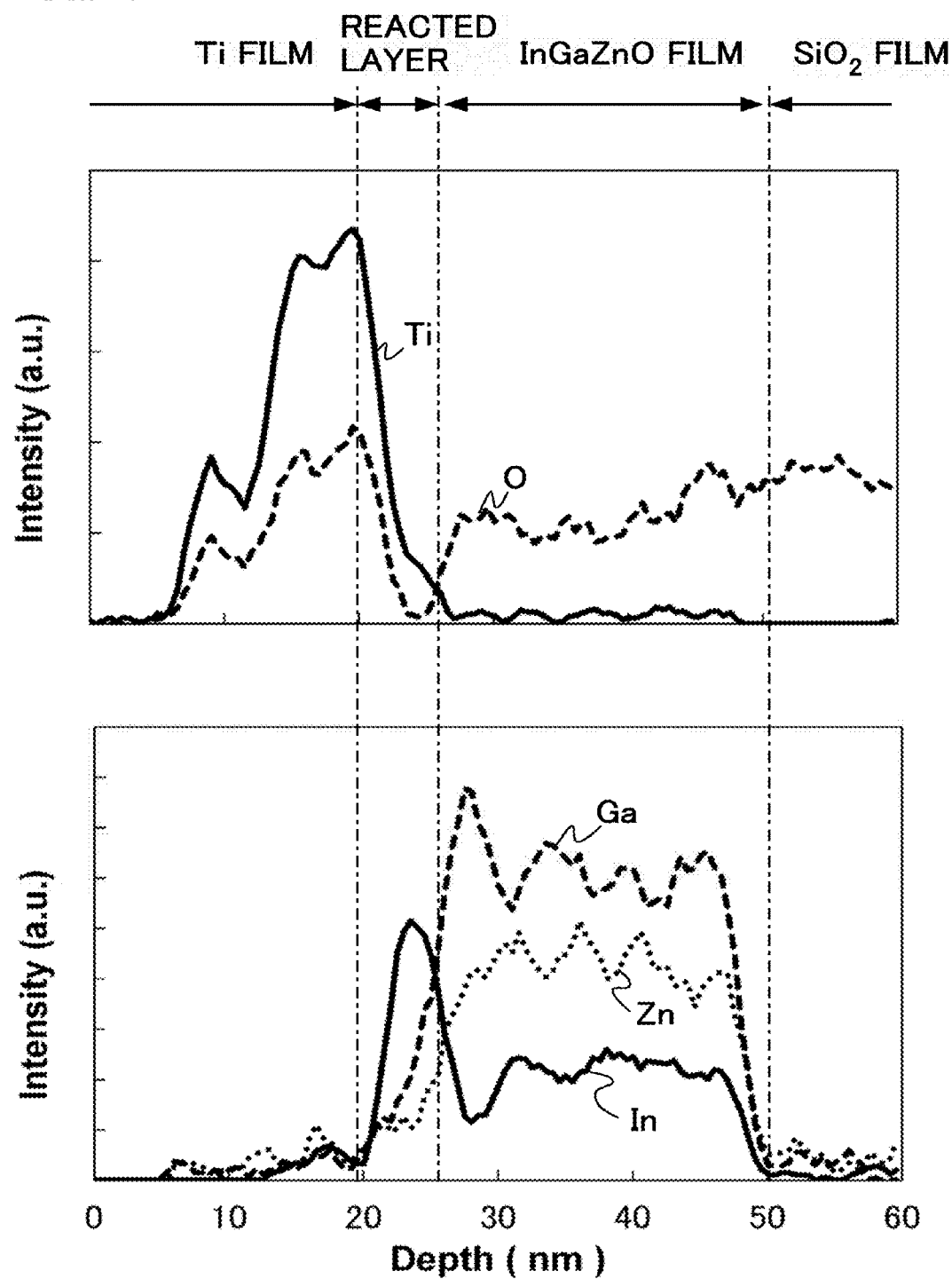
FIG. 13 illustrates functions and effects of the first embodiment.

FIG. 13 illustrates results of elemental analysis in a depth direction of the sample in FIG. 12. FIG. 13 illustrates a concentration profile in the depth direction of an element. The concentration profile of each element was measured by STEM-EELS.

The reacted layer contains at least indium (In) and titanium (Ti). The indium concentration in the reacted layer is higher than the indium concentration in the InGaZnO film under the reacted layer.

The oxygen concentration in the reacted layer is lower than the oxygen concentration in the InGaZnO film under the reacted layer. The lowest oxygen concentration in the reacted layer is lower than the lowest oxygen concentration in the InGaZnO film under the reacted layer. The zinc concentration in the reacted layer is lower than the zinc concentration in the InGaZnO film under the reacted layer. The gallium concentration in the reacted layer is lower than the gallium concentration in the InGaZnO film under the reacted layer.

The reacted layer is considered to be an alloy of indium and titanium.

In the thin film field effect transistor 100 of the present embodiment, the source region 11a and the drain region 11b of the oxide semiconductor layer 10 are formed of the reacted layer containing indium and a metal element and having a low resistance. Therefore, the parasitic resistance of the thin film field effect transistor 100 is reduced. Therefore, it is possible to realize the thin film field effect transistor 100 having an improved on-current.

The thin film field effect transistor 100 of the present embodiment has a top gate structure in which the gate electrode 14 is formed above the channel region 10a. Therefore, it is possible to form the source region 11a and the drain region 11b by self alignment with respect to the gate electrode 14. Therefore, it is possible to reduce an overlap capacitance between the gate electrode 14 and the source region 11a and between the gate electrode 14 and the drain region 11b. Therefore, the parasitic capacitance is reduced, and an operation speed of the thin film field effect transistor 100 is improved.

In addition, in the thin film field effect transistor 100 of the present embodiment, it is possible to form the source region 11a and the drain region 11b by self alignment with respect to the gate electrode 14. Therefore, for example, it is not necessary to provide an alignment tolerance between the source region 11a and the gate electrode 14 and between the drain region 11b and the gate electrode 14 in manufacturing. Therefore, it is possible to realize a highly-integrated semiconductor device by applying the thin film field effect transistor 100 of the present embodiment.

As described above, according to the present embodiment, it is possible to provide a semiconductor device having a reduced parasitic resistance in a source/drain region and an improved on-current. In addition, according to the present embodiment, it is possible to provide a semiconductor device having a reduced parasitic resistance and an improved operation speed. Furthermore, according to the present embodiment, it is possible to provide a highly-integrated semiconductor device.

(Second Embodiment)

A semiconductor device of the present embodiment is similar to that of the first embodiment except that a gate sidewall (layers) is provided on both sides of a gate electrode. Therefore, description of contents overlapping with the first embodiment will be omitted.

Figure 14A:
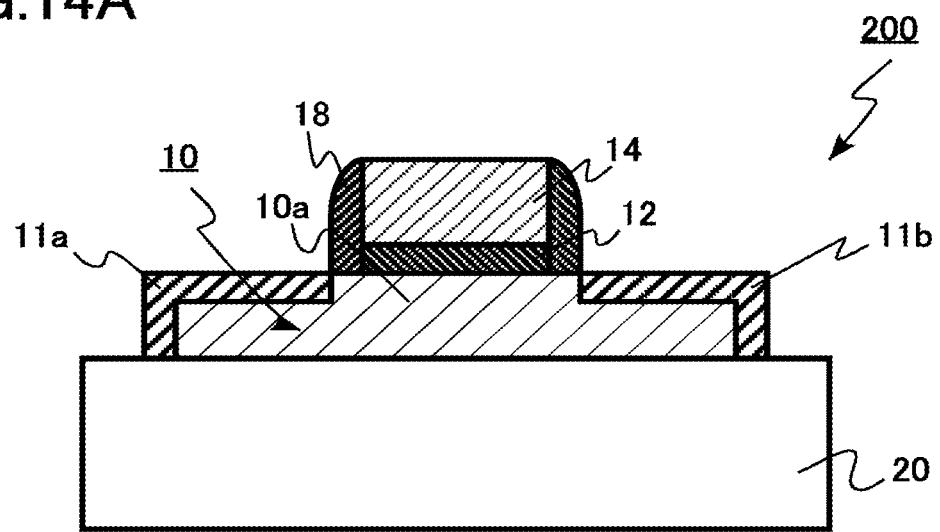
FIGS. 14A and 14B are schematic views of a semiconductor device according to a second embodiment.
Figure 14B:
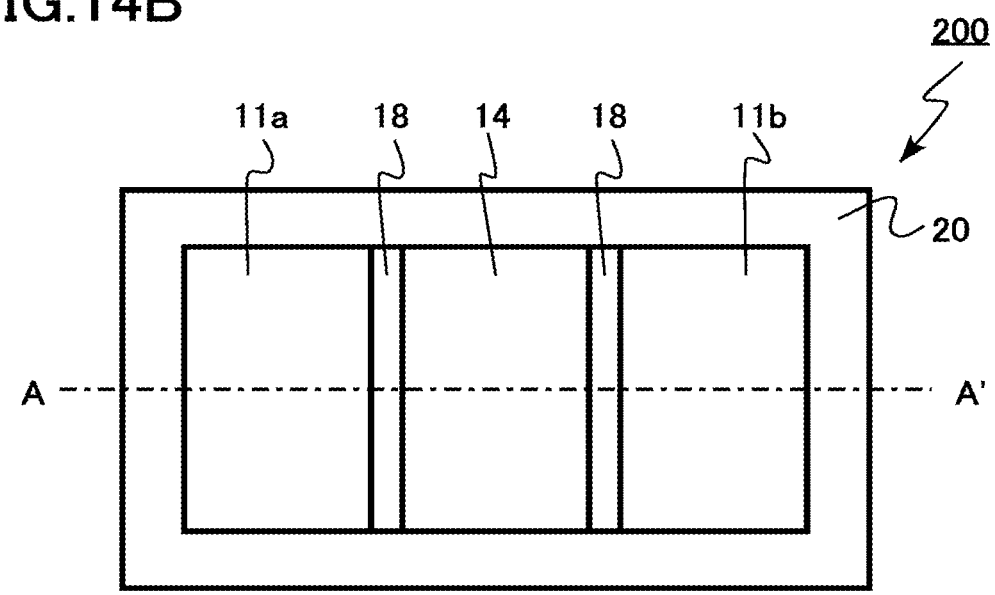

FIGS. 14A and 14B are schematic views of the semiconductor device of the present embodiment. FIG. 14A is a cross sectional view, and FIG. 14B is a top view. FIG. 14A is a cross sectional view cut by AA' in FIG. 14B.

In a semiconductor device 200 of the present embodiment, gate sidewalls (layers) 18 are provided on both sides of a gate electrode 14. The gate sidewall 18 is an insulating film. The gate sidewall 18 is, for example, a silicon oxide film, a silicon nitride film, or a silicon oxynitride film.

Next, a method for manufacturing the semiconductor device of the present embodiment will be described. FIGS. 15 to 19 are schematic cross sectional views illustrating the method for manufacturing the semiconductor device of the present embodiment. FIGS. 15 to 19 illustrate cross sections corresponding to the AA' cross section in FIG. 14B.

Figure 15:
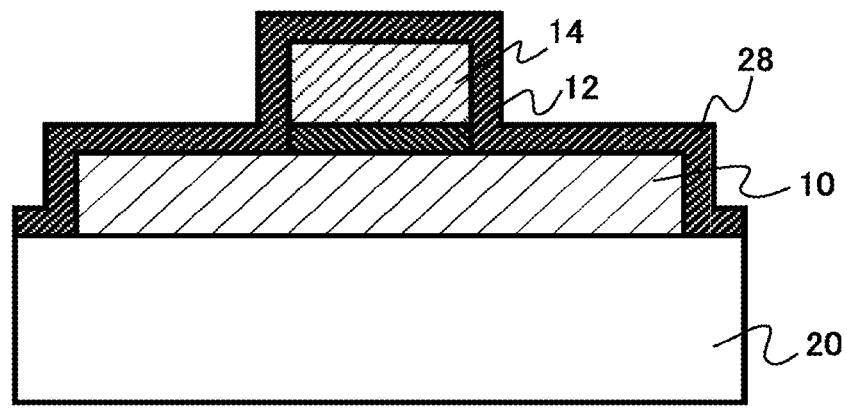
FIG. 15 is a schematic cross sectional view illustrating a method for manufacturing the semiconductor device according to the second embodiment.

As in the first embodiment, a mask material is formed, and a gate insulating film 12 and the gate electrode 14 are patterned. After the gate insulating film 12 and the gate electrode 14 are patterned, the mask material is removed. Thereafter, a gate side wall film 28 is formed on a gate electrode 14 and an oxide semiconductor layer 10 (FIG. 15). The gate side wall film 28 is formed, for example, by a CVD method.

Figure 16:
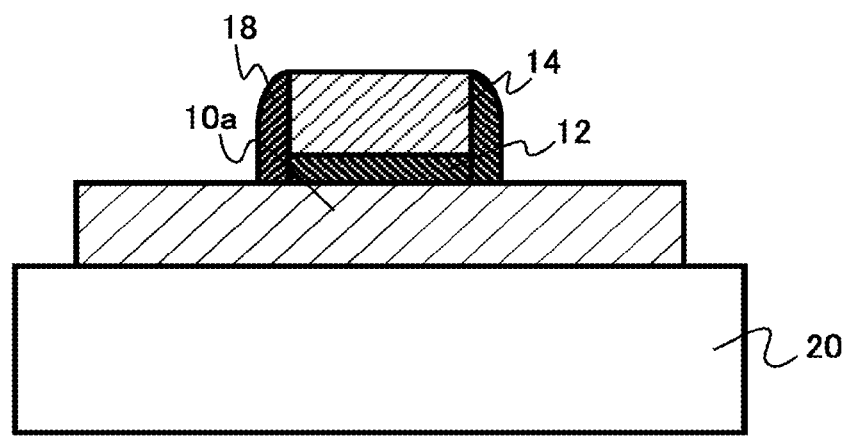
FIG. 16 is a schematic cross sectional view illustrating the method for manufacturing the semiconductor device according to the second embodiment.

Subsequently, the gate side wall film 28 is etched to form the gate sidewall 18 (FIG. 16). Etching of the gate side wall film 28 is performed by highly-anisotropic dry etching such as reactive ion etching (RIE).

Figure 17:
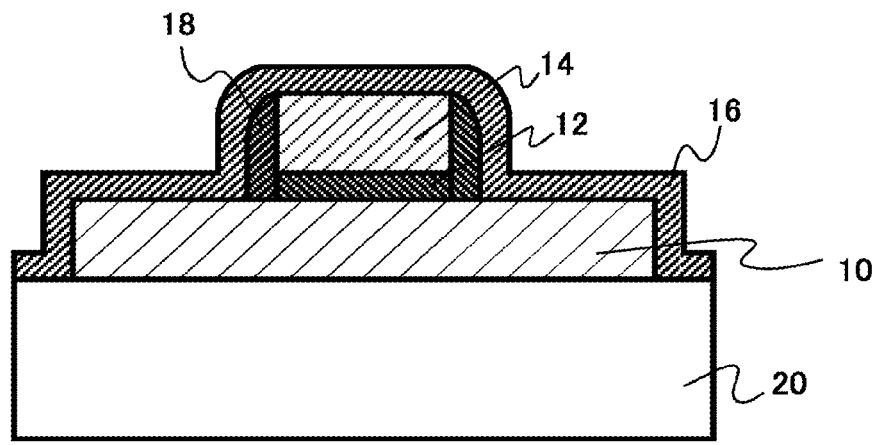
FIG. 17 is a schematic cross sectional view illustrating the method for manufacturing the semiconductor device according to the second embodiment.

Subsequently, a metal film 16 containing at least one metal element selected from the group consisting of titanium (Ti), tungsten (W), copper (Cu), zinc (Zn), aluminum (Al), lead (Pb), and tin (Sn) is formed on the oxide semiconductor layer 10 on both sides of the gate electrode 14 (FIG. 17).

Figure 18:
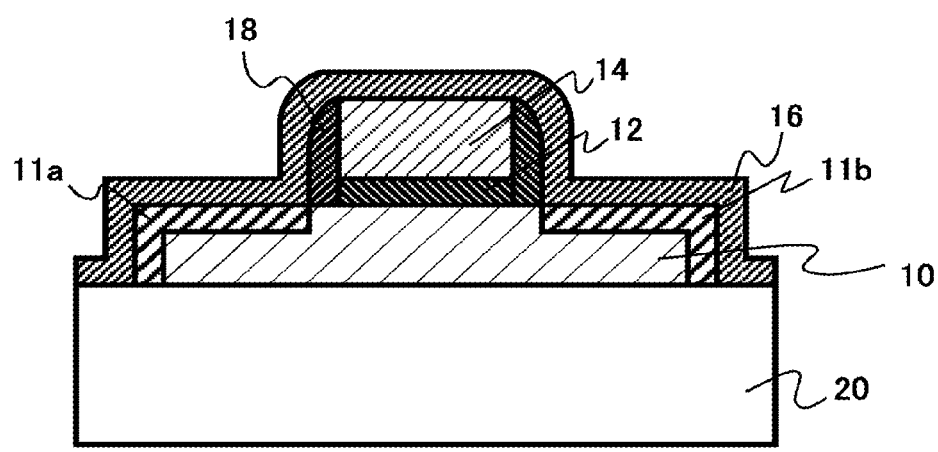
FIG. 18 is a schematic cross sectional view illustrating the method for manufacturing the semiconductor device according to the second embodiment.

Subsequently, a heat treatment is performed in a nonoxidizing atmosphere for one second or more and five minutes or less to react the metal film 16 with the oxide semiconductor layer 10. By the heat treatment, a reacted layer having a higher indium concentration than the oxide semiconductor layer 10 just under the gate electrode 14 and containing the above metal element is formed. The reacted layer formed by the heat treatment becomes a source region 11a and a drain region 11b (FIG. 18).

Figure 19:
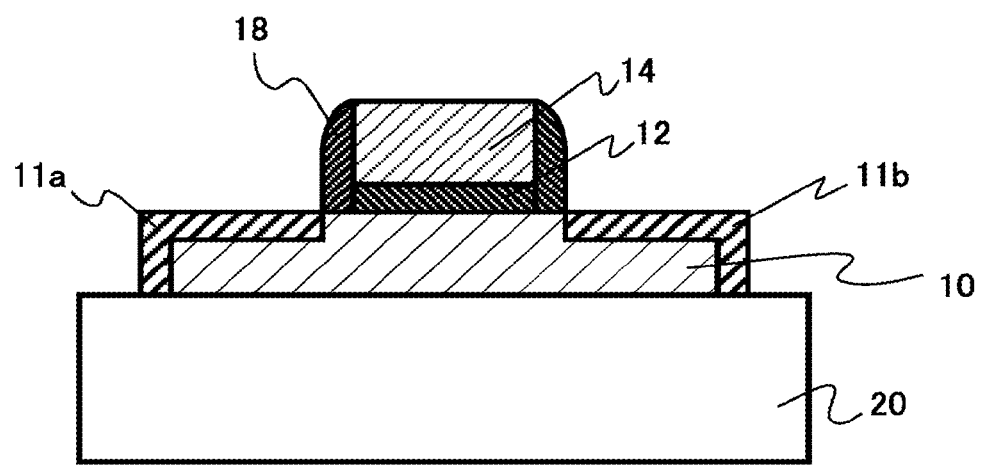
FIG. 19 is a schematic cross sectional view illustrating the method for manufacturing the semiconductor device according to the second embodiment.

Subsequently, the unreacted metal film 16 is removed by wet etching (FIG. 19).

The semiconductor device 200 of the present embodiment illustrated in FIGS. 14A and 14B is manufactured by the manufacturing method described above.

In the thin film field effect transistor 200 of the present embodiment, provision of the gate sidewall 18 makes an overlap amount between the gate electrode 14 and the source region 11a and between the gate electrode 14 and the drain region 11b smaller than that in the first embodiment. Therefore, it is possible to reduce the overlap capacitance between the gate electrode 14 and the source region 11a and between the gate electrode 14 and the drain region 11b. Therefore, a parasitic capacitance is further reduced, and an operation speed of the thin film field effect transistor 200 is improved.

(Third Embodiment)

A semiconductor device of the present embodiment is similar to that of the second embodiment except that the semiconductor device further includes a region having a lower indium (In) concentration than a channel region between the channel region and at least one of a source region and a drain region. Therefore, description of contents overlapping with the second embodiment will be omitted.

Figure 20A:
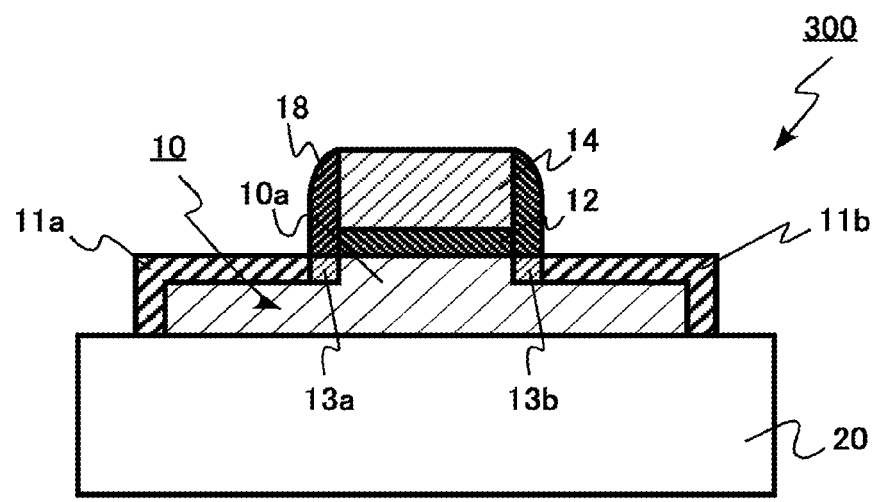
FIGS. 20A and 20B are schematic views of a semiconductor device according to a third embodiment.
Figure 20B:
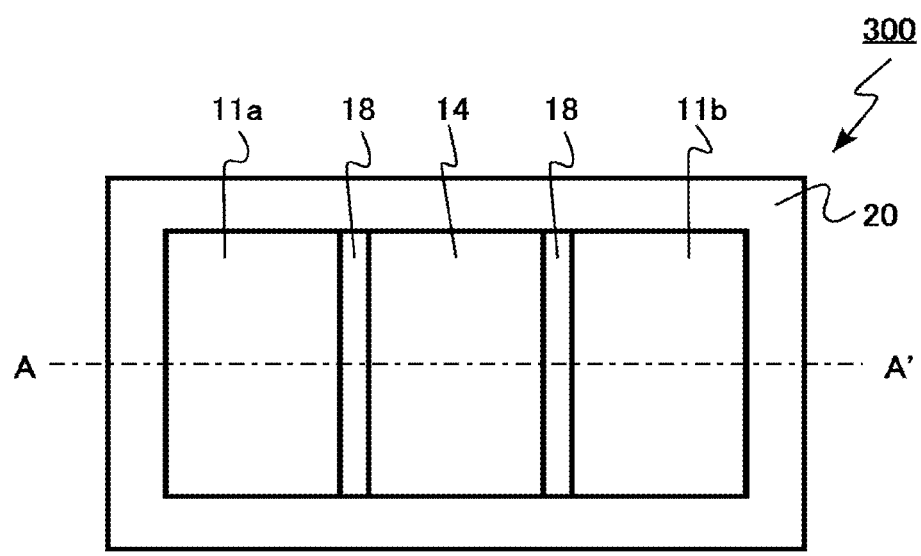

FIGS. 20A and 20B are schematic views of the semiconductor device of the present embodiment. FIG. 20A is a cross sectional view, and FIG. 20B is a top view. FIG. 20A is a cross sectional view cut by AA' in FIG. 20B.

A semiconductor device 300 of the present embodiment includes low indium concentration regions 13a and 13b having a lower indium concentration than a channel region 10a between the channel region 10a and a source region 11a and between the channel region 10a and a drain region 11b. The low indium concentration regions 13a and 13b have a lower indium concentration than an oxide semiconductor layer 10 under the low indium concentration regions 13a and 13b.

Each of the low indium concentration regions 13a and 13b is provided in the oxide semiconductor layer 10 just under a gate sidewall 18. The low indium concentration region may be provided between the channel region 10a and at least one of the source region 11a and the drain region 11b.

The low indium concentration regions 13a and 13b have a lower resistance than the channel region 10a and the oxide semiconductor layer 10 under the low indium concentration regions 13a and 13b. The indium concentration in the low indium concentration regions 13a and 13b is preferably 80% or less of the indium concentration of the channel region 10a from a viewpoint of reducing a parasitic resistance.

The resistance in the low indium concentration regions 13a and 13b is higher than the resistance in the source region 11a and the drain region 11b.

Figure 21:
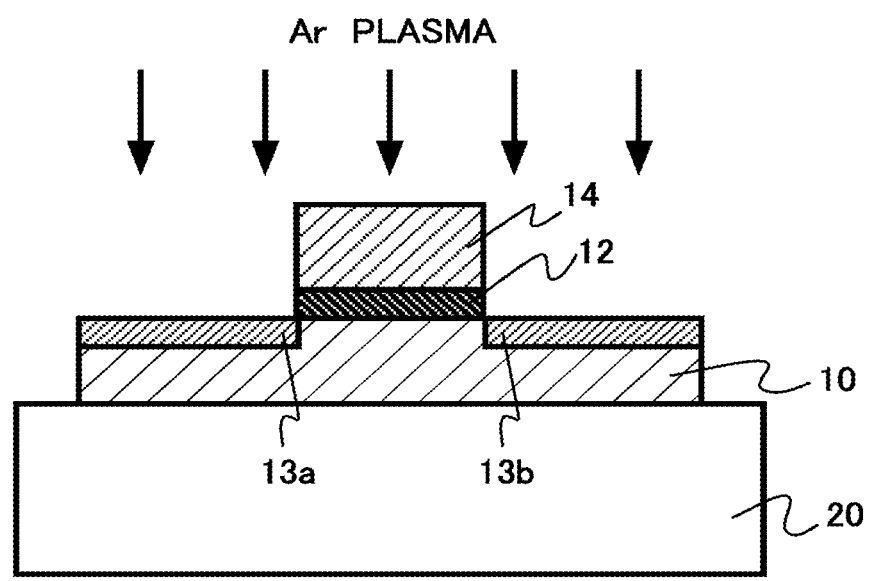
FIG. 21 is a schematic cross sectional view illustrating a method for manufacturing the semiconductor device according to the third embodiment.

Next, a method for manufacturing the semiconductor device of the present embodiment will be described. FIG. 21 is a schematic cross sectional view illustrating the method for manufacturing the semiconductor device of the present embodiment. FIG. 21 illustrates a cross section corresponding to the AA' cross section in FIG. 20B.

In the manufacturing method of the present embodiment, an argon (Ar) plasma treatment is performed before the step of forming the gate side wall film 28 in the manufacturing method of the second embodiment. This argon plasma treatment reduces an indium concentration of portions of the oxide semiconductor layer 10 the surface of which is exposed to reduce a resistance. This argon plasma treatment forms low indium concentration regions 13a and 13b having a low resistance and sandwiching a channel region 10a therebetween in the oxide semiconductor layer 10 (FIG. 21).

The plasma treatment does not necessarily have to use argon plasma, but may use other plasma such as helium plasma or hydrogen plasma. It is also possible to perform a heat treatment in a nonoxidizing atmosphere such as nitrogen annealing or argon annealing.

Thereafter, the semiconductor device 300 of the present embodiment illustrated in FIGS. 20A and 20B is manufactured by the manufacturing method similar to that in the second embodiment.

According to the present embodiment, provision of the low indium concentration regions 13a and 13b increases a degree of freedom of designing a transistor regarding increase in an on-current of the transistor and suppression of a short channel effect. Therefore, it is possible to realize the thin film field effect transistor 300 having excellent characteristics. In addition, provision of the low indium concentration regions 13b can relax an electric field on a side of the drain region 11b of the transistor. Therefore, it is possible to realize the thin film field effect transistor 300 having improved reliability.

In the first to third embodiments, the case where the source region 11a and the drain region 11b are provided on the oxide semiconductor layer 10 has been exemplified. However, the source region 11a and the drain region 11b may be provided directly on the insulating film 20.

While certain embodiments have been described, these embodiments have been presented by way of example only, and are not intended to limit the scope of the inventions. Indeed, a semiconductor device and a method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first region including an oxide semiconductor containing indium (In), gallium (Ga), and zinc (Zn);
a second region and a third region between which the first region is disposed, at least one of the second region and the third region having a higher indium (In) concentration than the first region and containing at least one metal element from the group consisting of titanium (Ti), tungsten (W), copper (Cu), zinc (Zn), aluminum (Al), lead (Pb), and tin (Sn);
an electrode; and
an insulating layer disposed between the first region and the electrode,
wherein a zinc (Zn) concentration in the at least one of the second region and the third region is lower than a zinc (Zn) concentration in the first region.

2. The device according to claim 1, wherein an oxygen concentration in the at least one of the second region and the third region is lower than an oxygen concentration in the first region.

3. A semiconductor device comprising:
a first region including an oxide semiconductor containing indium (In), gallium (Ga), and zinc (Zn);
a second region and a third region between which the first region is disposed, at least one of the second region and the third region having a higher indium (In) concentration than the first region and containing at least one metal element from the group consisting of titanium (Ti), tungsten (W), copper (Cu), zinc (Zn), aluminum (Al), lead (Pb), and tin (Sn);

an electrode; and an insulating layer disposed between the first region and the electrode, wherein a gallium (Ga) concentration in the at least one of the second region and the third region is lower than a gallium (Ga) concentration in the first region.

4. A semiconductor device comprising:
a first region including an oxide semiconductor containing indium (In), gallium (Ga), and zinc (Zn);
a second region and a third region between which the first region is disposed, at least one of the second region and the third region having a higher indium (In) concentration than the first region and containing at least one metal element from the group consisting of titanium (Ti), tungsten (W), copper (Cu), zinc (Zn), aluminum (Al), lead (Pb), and tin (Sn);
an electrode; and
an insulating layer disposed between the first region and the electrode,
wherein the at least one of the second region and the third region is made of polycrystalline metal.

5. The device according to claim 1, wherein the first region is amorphous.

6. The device according to claim 1, further comprising layers disposed on both sides of the electrode.

7. A semiconductor device comprising:
a first region including an oxide semiconductor containing indium (In), gallium (Ga), and zinc (Zn);
a second region and a third region between which the first region is disposed, at least one of the second region and the third region having a higher indium (In) concentration than the first region and containing at least one metal element from the group consisting of titanium (Ti), tungsten (W), copper (Cu), zinc (Zn), aluminum (Al), lead (Pb), and tin (Sn),
an electrode;
an insulating layer disposed between the first region and the electrode; and
a region having a lower indium (In) concentration than the first region between the first region and the at least one of the second region and the third region.

8. The device according to claim 1, wherein the oxide semiconductor contains at least one element from the group consisting of hafnium (Hf), tin (Sn), aluminum (Al), zirconium (Zr), lithium (Li), scandium (Sc), and nitrogen (N).

9. A method for manufacturing a semiconductor device comprising:
forming an oxide semiconductor layer containing indium (In), gallium (Ga), and zinc (Zn);
forming an insulating layer on the oxide semiconductor layer;
forming an electrode on the insulating layer;
forming a metal film containing at least one metal element from the group consisting of titanium (Ti), tungsten (W), copper (Cu), zinc (Zn), aluminum (Al), lead (Pb), and tin (Sn) on portions of the oxide semiconductor layer, the portions being exposed on both sides of the electrode;
performing a heat treatment in a nonoxidizing atmosphere for one second or more and five minutes or less and reacting the metal film with the oxide semiconductor layer to form a reacted layer; and
removing an unreacted portion of the metal film by wet etching.

10. The method according to claim 9, further comprising forming layers on both sides of the electrode before the forming the metal film.

11. The method according to claim 9, wherein the reacted layer has a higher indium (In) concentration than a portion of the oxide semiconductor layer facing to the electrode and the reacted layer contains the metal element.

12. The method according to claim 9, wherein temperature of the heat treatment is 200° C. or higher and 400° C. or lower.

13. The method according to claim 9, further comprising reducing an In concentration of the portions of the oxide semiconductor layer by a plasma treatment or a heat treatment after the forming the electrode and before the forming the metal film.

14. The device according to claim 7, wherein an oxygen concentration in the at least one of the second region and the third region is lower than an oxygen concentration in the first region.

15. The device according to claim 7, wherein the first region is amorphous.

16. The device according to claim 7, further comprising layers disposed on both sides of the electrode.

17. The device according to claim 7, wherein the oxide semiconductor contains at least one element from the group consisting of hafnium (Hf), tin (Sn), aluminum (Al), zirconium (Zr), lithium (Li), scandium (Sc), and nitrogen (N).

* * * * *